(12) United States Patent
Hsu

(10) Patent No.: US 9,490,265 B2
(45) Date of Patent: Nov. 8, 2016

(54) SEMICONDUCTOR DEVICE AND METHOD FOR FABRICATING THE SAME

(71) Applicant: UNITED MICROELECTRONICS CORP., Hsin-Chu (TW)

(72) Inventor: Chia-Fu Hsu, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/693,886

(22) Filed: Apr. 23, 2015

(65) Prior Publication Data

US 2016/0268311 A1 Sep. 15, 2016

(30) Foreign Application Priority Data

Mar. 13, 2015 (CN) .......................... 2015 1 0110254

(51) Int. Cl.
| | |
|---|---|
| *H01L 27/14* | (2006.01) |
| *H01L 27/12* | (2006.01) |
| *H01L 29/66* | (2006.01) |
| *H01L 29/786* | (2006.01) |
| *H01L 21/02* | (2006.01) |
| *H01L 21/46* | (2006.01) |
| *H01L 21/84* | (2006.01) |
| *H01L 29/24* | (2006.01) |

(52) U.S. Cl.
CPC ..... *H01L 27/1207* (2013.01); *H01L 21/02565* (2013.01); *H01L 21/02664* (2013.01); *H01L 21/46* (2013.01); *H01L 21/84* (2013.01); *H01L 29/24* (2013.01); *H01L 29/66477* (2013.01); *H01L 29/66969* (2013.01); *H01L 29/7869* (2013.01)

(58) Field of Classification Search
CPC ................................................. H01L 21/02483
USPC ........................ 257/43, 59, 72; 438/634, 740
See application file for complete search history.

(56) References Cited

U.S. PATENT DOCUMENTS

| | | | |
|---|---|---|---|
| 8,333,913 B2 | 12/2012 | Inoue et al. | |
| 2009/0173938 A1 | 7/2009 | Honda et al. | |
| 2011/0108706 A1* | 5/2011 | Koyama | H01L 27/14612 250/208.1 |
| 2012/0315735 A1 | 12/2012 | Koezuka et al. | |
| 2013/0126868 A1 | 5/2013 | Yamazaki et al. | |
| 2013/0270616 A1 | 10/2013 | Yamazaki | |

OTHER PUBLICATIONS

Liou, Title of Invention: Semiconductor Structure and Process Thereof, U.S. Appl. No. 14/687,932, filed Apr. 16, 2015.

* cited by examiner

*Primary Examiner* — Tan N Tran
(74) *Attorney, Agent, or Firm* — Winston Hsu; Scott Margo

(57) ABSTRACT

A semiconductor device is disclosed. The semiconductor device includes: a substrate having a metal-oxide semiconductor (MOS) transistor thereon, and an oxide semiconductor transistor adjacent to the MOS transistor. Preferably, the MOS transistor includes a first gate structure and a source/drain region adjacent to two sides of the gate structure, and the oxide semiconductor transistor includes a channel layer and the top surface of the channel layer is lower than the top surface of the first gate structure of the MOS transistor.

13 Claims, 3 Drawing Sheets

SEMICONDUCTOR DEVICE AND METHOD FOR FABRICATING THE SAME

BACKGROUND OF THE INVENTION

1. Field of the Invention

The invention relates to a method for fabricating semiconductor device, and more particularly, to a method of conducting UV ozone dehydrogenation process before or after forming oxide semiconductor layer.

2. Description of the Prior Art

Attention has been focused on a technique for formation of a transistor using a semiconductor thin film formed over a substrate having an insulating surface. The transistor is used in a wide range of electronic devices such as an integrated circuit (IC) and an image display device (display device). A silicon-based semiconductor material is widely known as a material for a semiconductor thin film applicable to a transistor, and within which, oxide semiconductor containing indium (In), gallium (Ga), and zinc (Zn) has been attracting attention.

A transistor including an oxide semiconductor film is known to have an extremely low leakage current in an off state. Nevertheless, current architecture of integrating transistor having oxide semiconductor film with metal-oxide semiconductor (MOS) transistor is still insufficient in bringing out optical performance of the device. Hence, how to improve the current fabrication flow for integrating oxide semiconductor transistor with MOS transistor has become an important task in this field.

SUMMARY OF THE INVENTION

According to a preferred embodiment of the present invention, a method for fabricating semiconductor device is disclosed. The method includes the steps of: providing a substrate having a base film thereon; performing a first ultraviolet (UV) treatment; forming an oxide semiconductor layer on the base film, wherein the oxide semiconductor layer comprises oxides and at least two metals; and performing a second UV treatment.

According to another aspect of the present invention, a method for fabricating semiconductor device is disclosed. The method includes the steps of: providing a substrate having a metal-oxide semiconductor (MOS) transistor thereon, in which the MOS transistor comprises a first gate structure and a source/drain region adjacent to two sides of the first gate structure; and forming an oxide semiconductor transistor adjacent to the MOS transistor, in which the oxide semiconductor transistor comprises a channel layer and the top surface of the channel layer is lower than the top surface of the first gate structure of the MOS transistor.

A semiconductor device is disclosed. The semiconductor device includes: a substrate having a metal-oxide semiconductor (MOS) transistor thereon, and an oxide semiconductor transistor adjacent to the MOS transistor. Preferably, the MOS transistor includes a first gate structure and a source/drain region adjacent to two sides of the gate structure, and the oxide semiconductor transistor includes a channel layer and the top surface of the channel layer is lower than the top surface of the first gate structure of the MOS transistor.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
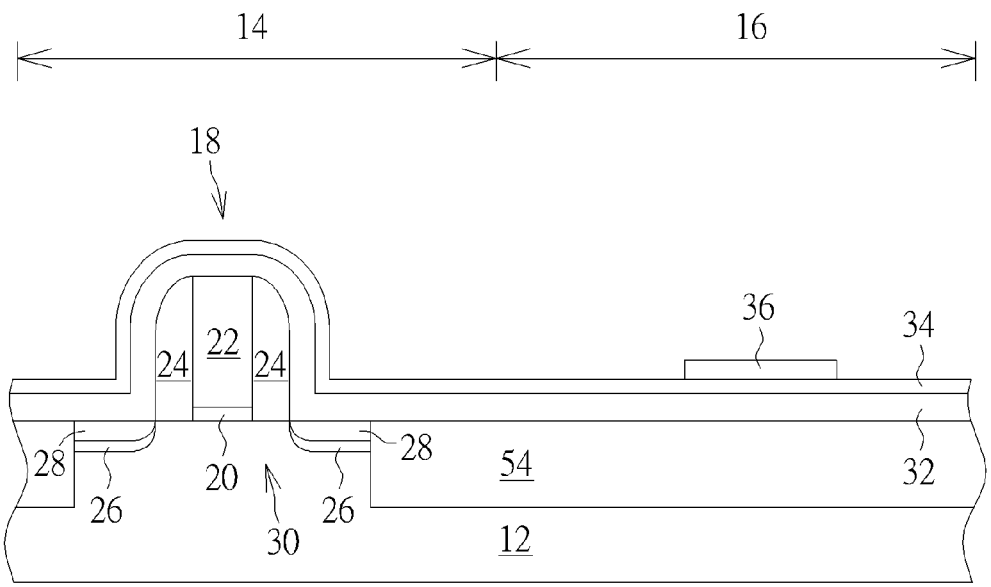
FIGS. 1-5 illustrate a method for fabricating semiconductor device according to a preferred embodiment of the present invention.

Referring to FIGS. 1-5, FIGS. 1-5 illustrate a method for fabricating semiconductor device according to a preferred embodiment of the present invention. As shown in FIG. 1, a substrate 12 is first provided, in which the substrate 12 could be a silicon substrate, epitaxial substrate, silicon carbide substrate, or silicon-on-insulator (SOI) substrate, but not limited thereto. In this embodiment, a first region 14 and a second region 16 are defined on the substrate 12, in which the first region 14 is used for fabricating a metal-oxide semiconductor (MOS) transistor while the second region 16 is used for forming an oxide-semiconductor (OS) transistor or thin film transistor (TFT) thereafter.

According to an embodiment of the present invention, a plurality of doped wells (not shown) and/or shallow trench isolations (STIs) (not shown) could be formed in the substrate 12. Also, it should be noted that even though the fabrication process of this embodiment pertains to a planar type transistor, the fabrication process could also be applied to non-planar transistor such as FinFET, and in such instance, the element 12 shown in FIG. 1 would then become a fin-shaped structure on a substrate.

Next, a gate structure 18 is formed on the first region 14 of the substrate 12, in which the formation of the gate structures 18 could be accomplished by a gate first process, a high-k first approach from gate last process, or a high-k last approach from gate last process. Since this embodiment pertains to a gate first approach, a gate dielectric layer, a gate material layer, and a selective hard mask could be formed on the substrate 12, and a pattern transfer process is conducted by using a patterned resist (not shown) as mask to remove part of the hard mask, part of the gate material layer, and part of the gate dielectric layer through single or multiple etching processes to form gate structure 18 composed of patterned gate dielectric layer 20 and gate electrode 22. A material layer composed of silicon oxide or silicon nitride is then deposited on the substrate 12 to cover the gate structure 18, and an etching back is carried out to remove part of the material layer for forming a spacer 24 adjacent to the gate structure 18. Next, a source/drain region 26 and/or epitaxial layer 28 is formed in the substrate 12 adjacent to two sides of the spacer 24, and a silicide (not shown) is selectively formed on the surface of the source/drain region 26 and/or epitaxial layer 28. This completes the formation of a MOS transistor 30 on the first region 14.

In this embodiment, the gate dielectric layer 20 is selected from the group consisting of $SiO_2$, SiN, and material having high dielectric constant, the gate electrode 22 could be composed of metal material, polysilicon, or silicides, the hard mask on the gate structure 18 could be selected from the group consisting of $SiO_2$, SiN, SiC, and SiON, but not limited thereto.

Next, a base film, such as a contact etch stop layer (CESL) 32 is deposited on the substrate 12 surface and the gate structure 18, and a first ultraviolet (UV) treatment, such as a UV ozone dehydrogenation process is conducted to improve the quality of an oxide semiconductor layer grown on the CESL 32 thereafter.

Next, a selective material layer 34 composed of $Al_2O_3$ is deposited on the CESL 32, an oxide semiconductor layer is then formed entirely on the material layer 32, and a photo-etching process is conducted to remove part of the oxide semiconductor layer for forming a patterned oxide semiconductor layer 36 on the second region 16, in which the oxide semiconductor layer 36 is preferably serving as a channel layer in the oxide semiconductor transistor formed thereafter. In this embodiment, the CESL 32 is preferably composed of silicon nitride, the oxide semiconductor layer 36 is selected from the group consisting of indium gallium zinc oxide (IGZO), indium aluminum zinc oxide, indium tin zinc oxide, indium aluminum gallium zinc oxide, indium tin aluminum zinc oxide, indium tin hafnium zinc oxide, and indium hafnium aluminum zinc oxide, but not limited thereto. After the oxide semiconductor layer 36 formed, a second UV treatment, such as another UV ozone hydrogenation process is conducted, in which this second UV treatment could be conducted after covering un-patterned oxide semiconductor layer 36 and before forming the patterned oxide semiconductor layer 36, or after forming the patterned oxide semiconductor layer 36.

Figure 2:
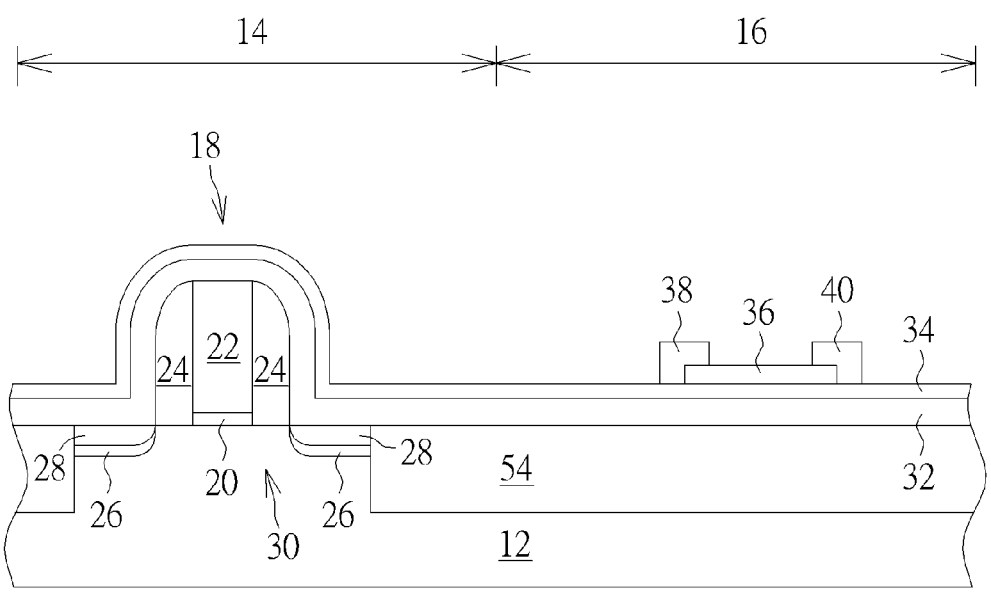

Next, as shown in FIG. 2, a chemical vapor deposition (such as plasma-enhanced CVD) or physical vapor deposition (such as ion sputter) is conducted to form a conductive layer (not shown) on the material layer 34 and covering the oxide semiconductor layer 36 entirely. In this embodiment, the conductive layer could be selected from the group consisting of aluminum, chromium, copper, tantalum, molybdenum, and tungsten, but not limited thereto. Next, a pattern transfer is conducted on the conductive layer by first forming a patterned resist (not shown) on the conductive layer and then performing an etching process to remove part of the conductive layer not covered by the patterned resist. This forms a source layer 38 and a drain layer 40 on part of the oxide semiconductor layer 36 surface and material layer 34 adjacent to two sides of the oxide semiconductor layer 36.

Figure 3:
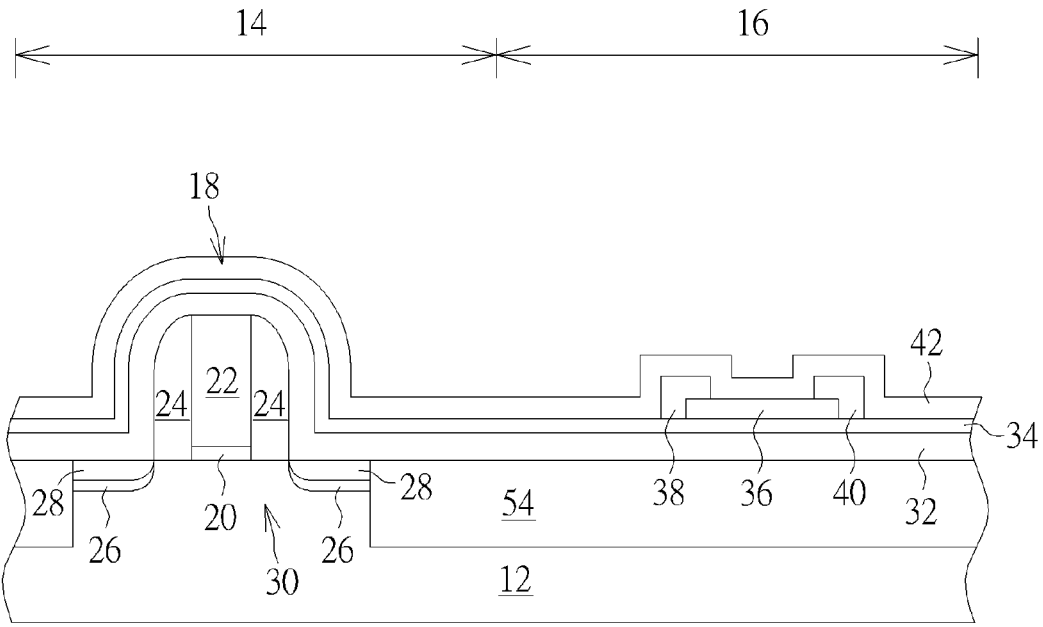

Next, as shown in FIG. 3, a gate insulating layer 42 is formed on the material layer 34, source layer 38, drain layer 40, and oxide semiconductor layer 36, in which the gate insulating layer 42 could be selected from the group consisting of $SiO_2$, SiN, SiC, and SiON, and could be a single-layered structure or multi-layered structure.

Figure 4:
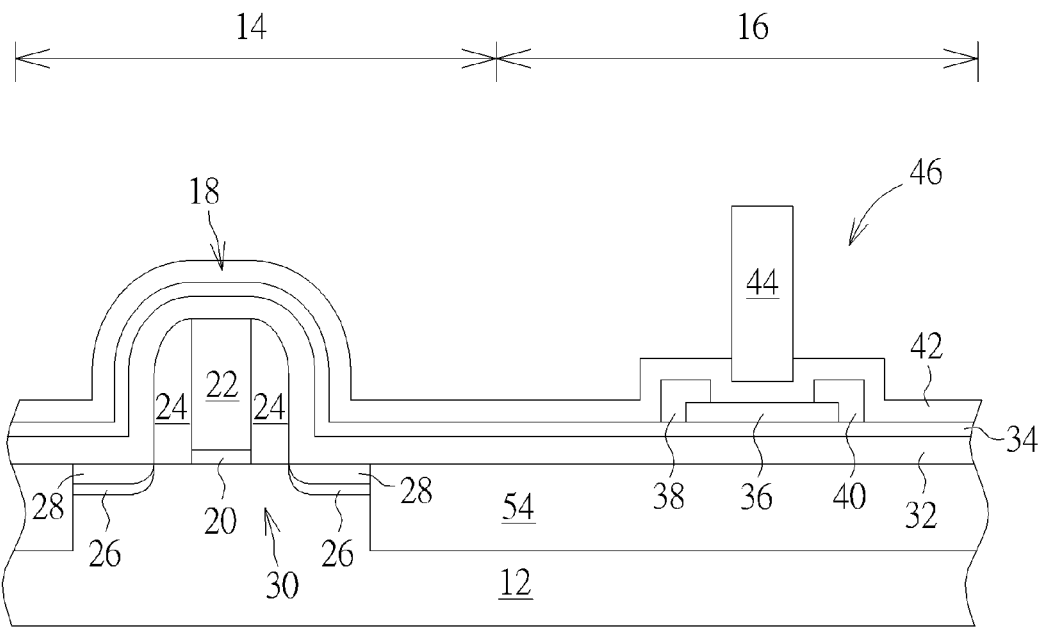

Next, as shown in FIG. 4, another conductive layer (not shown) is deposited on the gate insulating layer 42 entirely, and a pattern transfer is conducted on the conductive layer by first forming a patterned resist (not shown) on the conductive layer and then performing an etching process to remove part of the conductive layer not covered by the patterned resist. This forms a gate structure 44 on the gate insulating layer 42 and at the same time forms an oxide semiconductor transistor 46 on the second region 16. In this embodiment, the gate structure 44, the source layer 38, and the drain layer 40 could be composed of same material or different material. For instance, the gate structure 44 could be selected from the group consisting of aluminum, chromium, copper, tantalum, molybdenum, and tungsten, but not limited thereto.

In addition, it would also be desirable to perform a third UV treatment after forming the source layer 38 and drain layer 40 and before forming the gate structure 44, and a fourth UV treatment could also be conducted after the formation of gate structure 44, in which each of the third UV treatment and the fourth UV treatment could include a UV ozone dehydrogenation process, which is also within the scope of the present invention.

Figure 5:
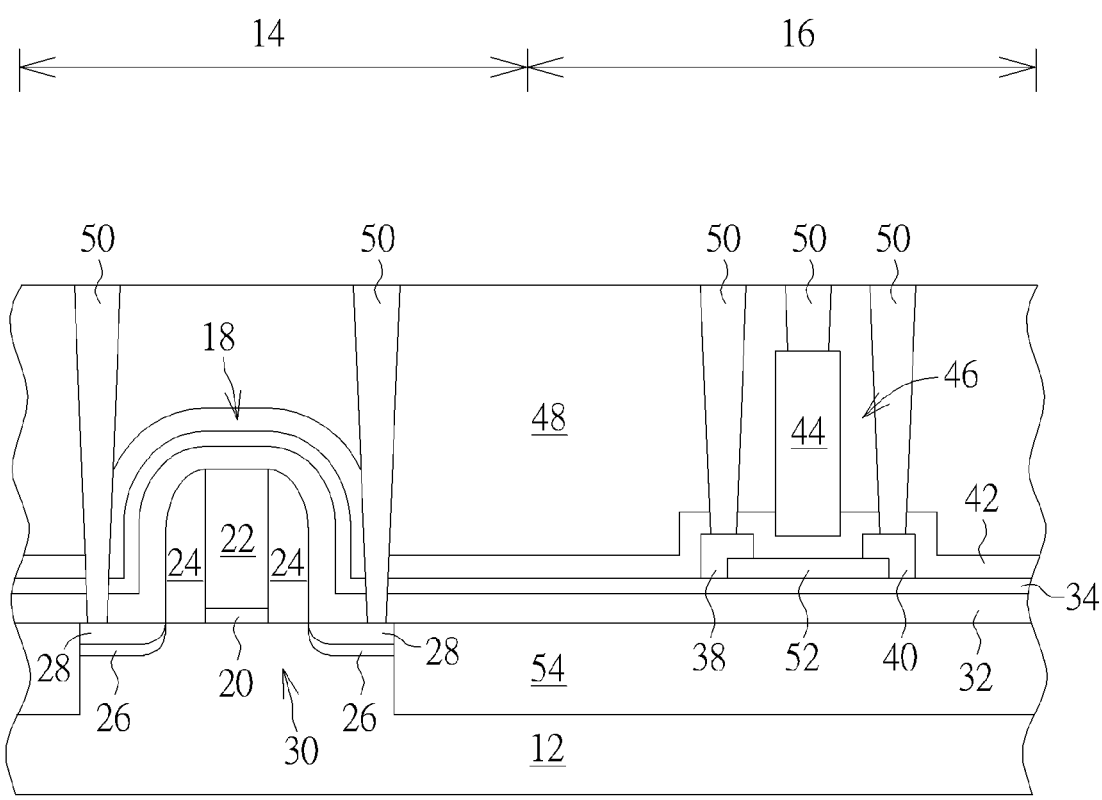

Next, as shown in FIG. 5, an interlayer dielectric (ILD) layer 48 is formed on the gate insulating layer 42 and covering the gate structure 44 entirely, and a plurality of contact plugs 50 are formed in the ILD layer 48, gate insulating layer 42, material layer 34, and CESL 32 for electrically connecting the gate structure 44, source layer 38, and drain layer 40 of oxide semiconductor transistor 46 on the second region 16 and the source/drain region 26 of MOS transistor 30 on the first region 14. This completes the fabrication of a semiconductor device according to a preferred embodiment of the present invention.

Referring again to FIG. 5, which further illustrates a structural view of a semiconductor device according to a preferred embodiment of the present invention. As shown in FIG. 5, the semiconductor device includes a substrate 12, a MOS transistor 30 disposed on the substrate 12, a CESL 32 disposed on the MOS transistor 30 and substrate 12, and an oxide semiconductor transistor 46 disposed on the CESL 32 and STI 54 adjacent to the MOS transistor 30. Preferably, the MOS transistor 30 includes a gate structure 18 and a source/drain region 26 adjacent to two sides of the gate structure 18, the MOS transistor 46 includes a channel layer 52 (also being the aforementioned oxide semiconductor layer 36), a source layer 38 and a drain layer 40 disposed on the CESL 32 and part of the channel layer 52, a gate structure 44 disposed directly on top of the channel layer 52, and a gate insulating layer 42 between the gate structure 44 and source layer 38, drain layer 40, and channel layer 52 and covering the CESL 32.

In this embodiment, the top surface of the channel layer 52 is preferably lower than the top surface of the gate structure 18 of MOS transistor 30, the bottom surface of the channel layer 52 is higher than the bottom surface of the gate structure 18 of MOS transistor 30, and the channel layer 52 is selected from the group consisting of indium gallium zinc oxide (IGZO), indium aluminum zinc oxide, indium tin zinc oxide, indium aluminum gallium zinc oxide, indium tin aluminum zinc oxide, indium tin hafnium zinc oxide, and indium hafnium aluminum zinc oxide. In addition, a ILD layer 48 is disposed on the MOS transistor 30 of first region 14 and oxide semiconductor transistor 46 of second region 16 and directly connecting the gate insulating layer 42 and gate structure 44 of oxide semiconductor transistor 46.

Overall, the present invention preferably conducts an ultraviolet treatment, such as a UV ozone dehydrogenation before or after forming oxide semiconductor layer on a base film to improve the growth quality of the oxide semiconductor layer. Moreover, another embodiment of the present invention preferably forms an oxide semiconductor transistor or thin film transistor directly on a CESL and then forms an ILD layer so that the ILD layer is covered on and contacting both the MOS transistor and oxide semiconductor transistor at the same time.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A method for fabricating semiconductor device, comprising:
   providing a substrate having a metal-oxide semiconductor (MOS) transistor thereon, wherein the MOS transistor comprises a first gate structure and a source/drain region adjacent to two sides of the first gate structure;
   forming a contact etch stop layer (CESL) on the first gate structure and the source/drain region;

forming an oxide semiconductor transistor on the CESL and adjacent to the MOS transistor, wherein the oxide semiconductor transistor comprises a channel layer and the top surface of the channel layer is lower than the top surface of the first gate structure of the MOS transistor.

2. The method of claim 1, further comprising:
forming the contact etch stop layer (CESL) on the MOS transistor and the substrate;
forming the channel layer on the CESL;
forming a source layer and a drain layer on the CESL and adjacent to the channel layer;
forming a gate insulating layer on the CESL, the source layer, the drain layer, and the channel layer; and
forming a second gate structure on the channel layer.

3. The method of claim 2, further comprising forming an interlayer dielectric (ILD) layer on the CESL and the second gate structure.

4. The method of claim 3, further comprising forming a plurality of contact plugs in the ILD layer, the gate insulating layer, and the CESL for electrically connecting to the second gate structure, the source layer, the drain layer, and the source/drain region of the MOS transistor.

5. The method of claim 1, wherein the oxide semiconductor layer is selected from the group consisting of indium gallium zinc oxide (IGZO), indium aluminum zinc oxide, indium tin zinc oxide, indium aluminum gallium zinc oxide, indium tin aluminum zinc oxide, indium tin hafnium zinc oxide, and indium hafnium aluminum zinc oxide.

6. A semiconductor device, comprising:
a substrate having a metal-oxide semiconductor (MOS) transistor thereon, wherein the MOS transistor comprises a first gate structure and a source/drain region adjacent to two sides of the gate structure;
a contact etch stop layer (CESL) on the first gate structure and the source/drain region; and
an oxide semiconductor transistor on the CESL and adjacent to the MOS transistor, wherein the oxide semiconductor transistor comprises a channel layer and the top surface of the channel layer is lower than the top surface of the first gate structure of the MOS transistor.

7. The semiconductor device of claim 6, further comprising the contact etch stop layer (CESL) on the MOS transistor and the substrate.

8. The semiconductor device of claim 7, wherein the channel layer is on the CESL.

9. The semiconductor device of claim 8, further comprising:
a source layer and a drain layer on the CESL and the channel layer;
a gate insulating layer on the CESL, the source layer, the drain layer, and the channel layer; and
a second gate structure on the gate insulating layer.

10. The semiconductor device of claim 9, further comprising an interlayer dielectric (ILD) layer on the MOS transistor and the gate insulating layer.

11. The semiconductor device of claim 10, further comprising a plurality of contact plugs in the ILD layer, the gate insulating layer, and the CESL for electrically connecting to the second gate structure, the source layer, the drain layer, and the source/drain region of the MOS transistor.

12. The semiconductor device of claim 6, wherein the bottom surface of the channel layer is higher than the bottom surface of the first gate structure.

13. The semiconductor device of claim 6, wherein the channel layer is selected from the group consisting of indium gallium zinc oxide (IGZO), indium aluminum zinc oxide, indium tin zinc oxide, indium aluminum gallium zinc oxide, indium tin aluminum zinc oxide, indium tin hafnium zinc oxide, and indium hafnium aluminum zinc oxide.

* * * * *